United States Patent [19]

Plumton et al.

[11] Patent Number: 5,077,231

[45] Date of Patent: Dec. 31, 1991

[54] METHOD TO INTEGRATE HBTS AND FETS

[75] Inventors: Donald L. Plumton, Dallas; Francis J. Morris, Plano; Jau-Yuann Yang, Richardson, all of Tex.

[73] Assignee: Texas Instruments Incorporated, Dallas, Tex.

[21] Appl. No.: 670,094

[22] Filed: Mar. 15, 1991

[51] Int. Cl.$^5$ .......................................... H01L 21/18
[52] U.S. Cl. .................................... 437/51; 437/56; 437/59; 437/126; 437/133; 148/DIG. 9; 148/DIG. 72
[58] Field of Search ................... 437/51, 56, 57, 133, 437/31, 33, 59, 126; 148/DIG. 9, DIG. 72; 357/16, 43

[56]  References Cited

U.S. PATENT DOCUMENTS

| | | | |
|---|---|---|---|
| 4,821,090 | 4/1989 | Yokoyama | 357/43 |
| 4,830,980 | 5/1989 | Hsieh | 437/56 |
| 4,929,570 | 5/1990 | Howell | 357/43 |
| 5,012,318 | 4/1991 | Honjo | 357/43 |

FOREIGN PATENT DOCUMENTS

| | | | |
|---|---|---|---|
| 0307850 | 3/1989 | European Pat. Off. | 357/43 |
| 0080064 | 3/1989 | Japan | 357/16 |

OTHER PUBLICATIONS

Itakura et al., "A GaAs Bi-FET Technology For Large Scale Integration", IEDM, 1989, pp. 389-392.
K. Itakura et al.; *A GaAs Bi-FET Technology for Large Scale Integration*; IEEE 1989; pp. 15.2.1-15.2.4.

Primary Examiner—Brian E. Hearn
Assistant Examiner—Tuan Nguyen
Attorney, Agent, or Firm—Melvin Sharp; James T. Comfort; N. Rhys Merrett

[57]  ABSTRACT

This is a method for fabricating integrated heterojunction bipolar transistors (HBTs) and heterojunction field effect transistors (HFETs) on a substrate. The method comprises: forming a subcollector layer 12 over the substrate 10; forming a collector layer 14 over the subcollector layer; forming a base layer 16 over the collector layer; etching the base layer to form one or more base pedestals 16 over a portion of the collector layer; forming a buffer region 18 in a portion of the collector layer over which one or more HFETs are fabricated; forming one or more channel regions 20,22 over the buffer region; forming a wide bandgap material emitter/gate layer 26 over the base pedestal and the channel region; forming isolation regions 30,32, whereby there is one or more separate HBTs and one or more separate HFETs over the substrate utilizing an epitaxially grown emitter/gate layer to form both an HBT emitter and an HFET gate. Other devices and methods are also disclosed.

10 Claims, 4 Drawing Sheets

METHOD TO INTEGRATE HBTS AND FETS

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

CROSS-REFERENCE TO RELATED APPLICATIONS

The following coassigned patent applications are hereby incorporated herein by reference: Ser. No. 312,101 filed 02/16/89.

FIELD OF THE INVENTION

This invention relates to semiconductor electronic integrated circuits, and more particularly, to integrated circuits made of III–V compound semiconductors including both field effect and bipolar devices.

BACKGROUND OF THE INVENTION

Improved performance as well as increased circuit flexibility is made possible by integrating both NPN and PNP bipolar transistors on the same chip. Silicon digital circuits make use of vertical NPN switching transistors as well as lateral PNP transistors for input logic, current sources and level shifting. The addition of field effect transistors (FETs) with silicon bipolar transistors result in analog circuits which operate at high speeds while offering very high input impedances. The versatility of combining bipolar circuits and FETs in an integrated circuit is well known. Further, the integration of silicon CMOS and bipolar transistors (BICMOS) combining the density of CMOS with the high drive of bipolar has appeared in commercial products.

Historically, GaAs/AlGaAs heterojunction bipolar transistors (HBT) have been fabricated using mesa technology in which the collector, base and emitter epi layer are sequentially grown during a single epitaxial deposition run. The emitter and base epi layer are selectively removed using two etch stops for making contact to the base and collector areas, respectively. These etches result in steps in the GaAs ranging in height between 0.4 and 1.0 micron for a typical mesa HBTs. Although high quality HBTs can be fabricated in this manner, the resulting mesa structure results in very severe topography making it difficult to incorporate a multilevel metal system as required for high levels of integration.

Planar heterojunction bipolar transistors have been fabricated as elements of integrated circuits in the emitter-down configuration. This avoids the mesa topography but has the drawbacks of limited NPN base doping and limited multiple device integration possibilities. The deep base implant through the collector limits the base doping resulting in a high base sheet resistance and a "flat" doping profile. To integrate any more devices would require major changes in the epi and many additional processing steps. In addition, this technology requires all of the NPN transistors to be connected in the common emitter configuration which severely limits its applications.

Although a single epitaxial deposition run as used in the foregoing mesa HBTs and emitter-down HBTs does simplify the fabrication process, it limits the types of structures which can be integrated together on a single chip.

Heterojunction bipolar transistors (HBT) show a very high speed performance because of the wide bandgap emitter which allows the base to be more heavily doped than the emitter, maintaining high emitter injection efficiencies. There is a limitation for integrating these devices due to large power dissipation.

GaAs/AlGaAs FETs, however, have very low power dissipation, but have poor current driving capability, causing degradation of the propagation delay with the increase of fanout. Thus, there is a need for a method to combine HBTs and FETs on the same integrated circuit, as has been done for silicon bipolar and FET devices in BiCMOS.

SUMMARY OF THE INVENTION

This is a method for fabricating integrated heterojunction bipolar transistors (HBTs) and heterojunction field effect transistors (HFETs) on a substrate. The method comprises: forming a subcollector layer over the substrate; forming a collector layer over the subcollector layer; forming a base layer over the collector layer; etching the base layer to form one or more base pedestals over a portion of the collector layer; forming a buffer region in a portion of the collector layer over which one or more HFETs are fabricated; forming one or more channel regions over the buffer region; forming a wide bandgap material emitter/gate layer over the base pedestal and the channel region; forming isolation regions, whereby there is one or more separate HBTs and one or more separate HFETs over the substrate utilizing an epitaxially grown emitter/gate layer to form both an HBT emitter and an HFET gate.

Preferably a highly doped low resistance contact to the top surface is formed in a portion of the collector layer and the subcollector layer prior to forming the emitter/gate layer; two HFET channels are formed, one being an enhancement channel and one being a depletion channel; a very highly doped cap layer is formed over the emitter/gate layer, whereby the cap layer improves ohmic contact for both the HBT and the HFET; the isolation regions are oxygen and/or boron, whereby the isolation region used to isolate the HBTs from the HFETs is deeper than the remainder of the isolation regions; grading layers are formed over and/or under the emitter/gate layer, whereby the grading layers provide a smooth bandgap transition and serve as an etch stop during selective etching; the emitter/gate layer is AlGaAs; and the subcollector layer, the collector layer, and the base layer are GaAs. A MESFET, A J-FET and/or a MISFET may also be formed over the buffer region. The HBTs may be NPN and the HFETs may be n-channel.

This is also a device integrating heterojunction bipolar transistors (HBTs) and heterojunction field effect transistors (HFETs) on a substrate. The device comprises: a subcollector layer over the substrate; a collector layer over the subcollector layer; a base pedestal over a portion of the collector layer; a buffer region in a portion of the collector layer over which one or more HFETs are fabricated; one or more channel regions over the buffer region; a wide bandgap material emitter/gate layer over the base pedestal, and the channel region; and isolation regions, whereby there is one or more separate HBTs and one or more separate HFETs over the substrate utilizing an epitaxially grown emitter/gate layer as both an HBT emitter and an HFET gate.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1A:
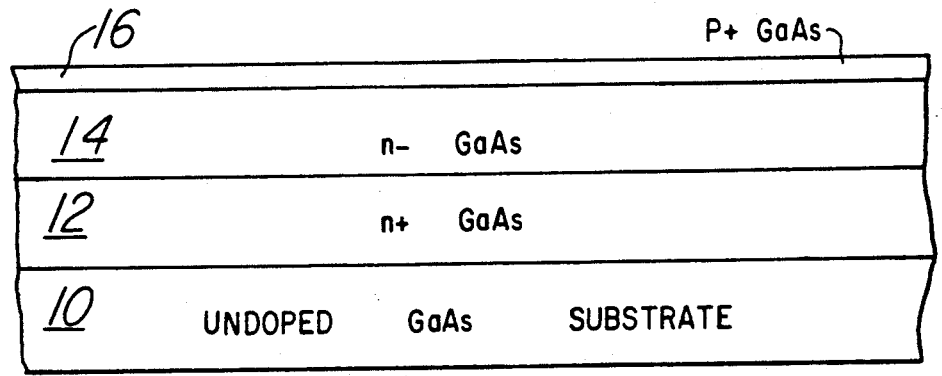
FIGS. 1a-1e are cross-sectional views of a preferred embodiment of the present invention during sequential steps.
Figure 1B:
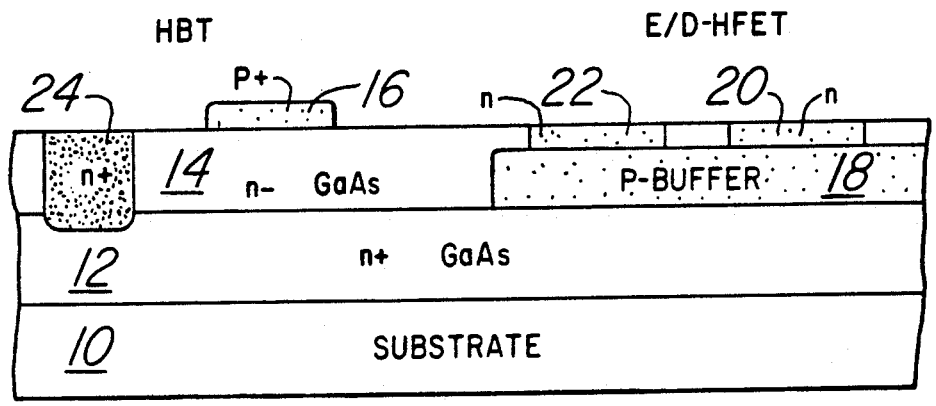

The HBT/FET (BiFET) merged process flow of a first preferred embodiment is illustrated in FIG. 1a-1e. Table 1 below may be referred to for clarification of the element numbers in the drawings. This process flow is designed to fabricate heterojunction bipolar transistors (HBTs) integrated with heterojunction field effect transistors (HFETs). As used herein, the term "HFET" is taken to mean doped channel heterojunction FETs and does not include "J-FETs", "MESFETs", OR "MISFETs". Referring to FIG. 1a, a n+ subcollector layer 12, preferably 1 um thick and doped at least $2 \times 10^{18}/cm^3$, is epitaxially formed over a semi-insulating GaAs substrate 10. A n- collector layer 14, preferably 6000 Å thick and doped $2 \times 10^{16}/cm^3$, is epitaxially formed over the subcollector layer 12. A p+ base layer 16, preferably 1000 Å thick and doped between $2 \times 10^{18}/cm^3$ and $5 \times 10^{19}/cm^3$, is epitaxially formed over the collector layer 14. The epitaxial layers are grown preferably by a metalorganic chemical vapor deposition (MOCVD) process, but may be grown, for example, by a molecular beam epitaxy (MBE) process. The first lithography level defines the base 16 by etching away the base layer 16 and leaving base "pedestals" 16 approximately 1,300 Å high. This concurrently creates the first set of alignment marks. Four different implant mask levels are then used on the collector layer 14, as shown in FIG. 1b. The n+ implant 24 forms a low resistance collector contact to the top surface. A p-buffer implant 18, preferably implanted with Be at 120 keV, $5 \times 10^{12}/cm^2$, is used for isolation and substrate bias of the HFET channels. The p-buffer 18 doping is preferably p-, to minimize capacitance between the p-buffer 18 and the subcollector 14, but may be more heavily doped if desired. The n type enhancement-channel 22 and depletion-channel 20 implants are both selectively implanted, preferably with Si at 30 keV, $6 \times 10^{12}/cm^2$, and 30 keV, $6 \times 10^{12}/cm^2$ + 60 keV, $3 \times 10^{12}/cm^2$, respectively. The channel implants may be implanted through a 400 Å $Si_3N_4$ (nitride) film, not shown, to prevent channeling and to shape the channel. The implant energy and fluence may be lowered if the nitride is deleted. An implantation profile of the p-buffer 18, the enhancement channel 22, the depletion channel 20, the nitride film, the collector 14, and the subcollector 12 is shown in FIG. 2. After these first four implants, the sample is preferably annealed and cleaned before overgrowth of the second epitaxial layer.

Figure 1C:
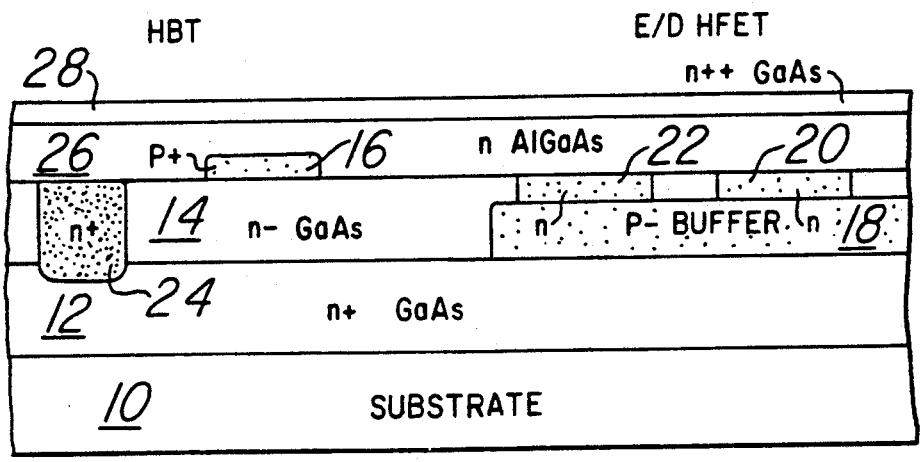
Figure 1D:
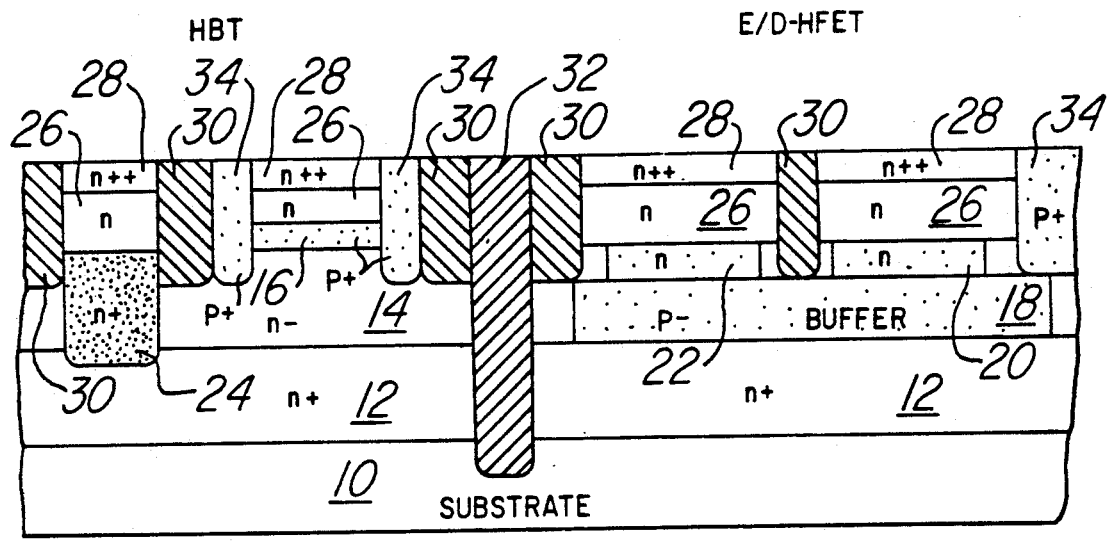
Figure 2:
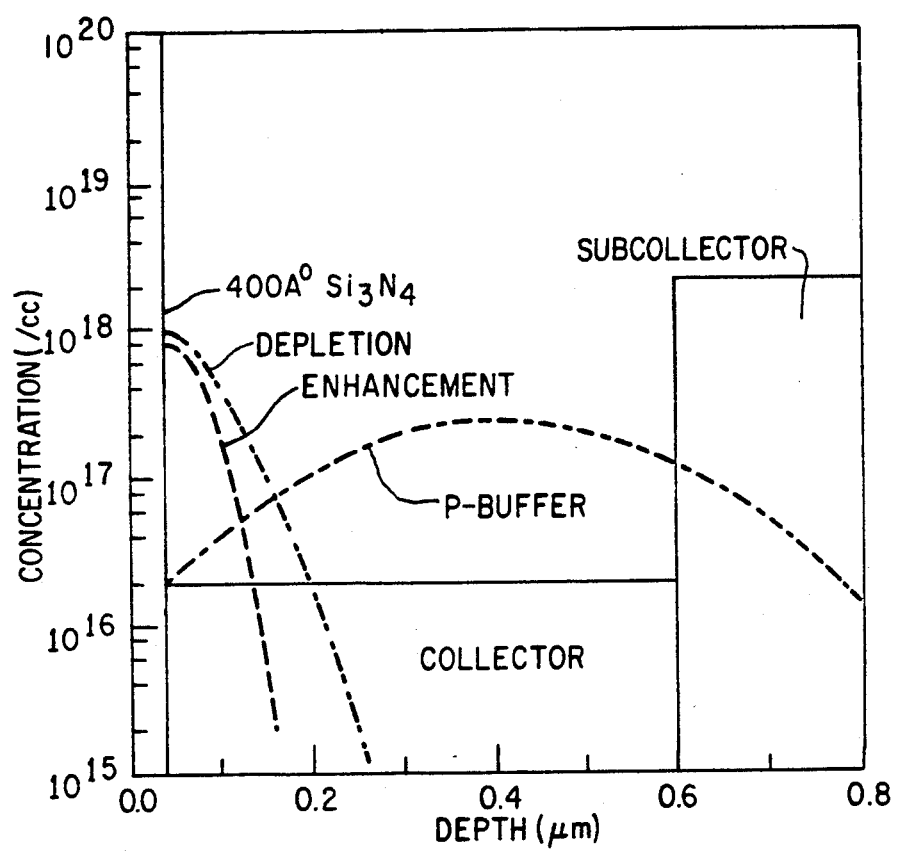
FIG. 2 is an implantation profile of portions of the preferred embodiment shown in FIGS. 1a-1e.

The AlGaAs emitter/gate layer 26, preferably 1500 Å thick and doped $2 \times 10^{17}/cm^3$, is overgrown onto the first epitaxial base pedestal 16 and collector layer 14, forming the emitter/base junction for the HBT and the gate/channel junction for the HFET, shown in FIG. 1c. If desired, grading layers may be placed between the AlGaAs 26 and the GaAs layers 14,16 and/or 28 to provide a smooth bandgap transition and/or to serve as an etch stop during selective etching. Also, diffusion barriers of undoped or less heavily doped material may be used between the emitter 26 and base 16 and/or between the base 16 and collector 14 of the HBT. An n++ cap layer 28, preferably 1000 Å thick and doped $1 \times 10^{19}/cm^3$, may be formed over the AlGaAs layer 26 to improve ohmic contact. Three more lithographically defined implants connect the buried p-regions and provide device isolation, shown in FIG. 1d. First, p+ implants 34 makes connection from the base 16 to the top surface for the HBT and from the p-buffer 18 to the top surface for the HFET substrate bias. Next, boron implants 30 isolates the HFETs from each other and define the outer p+ extrinsic base for the HBT. All the implants in the process up to now may be completely defined with resist so that definition and cleanup are relatively easy. The oxygen isolation implant 32 is preferably done with a gold-plated mask, for example, since the implant must penetrate approximately 4 um. The key advantages of the deep oxygen implant 32 are that it allows maintenance of surface planarity, and it makes all the GaAs epitaxial layers between devices and under the metal interconnect semi-insulating. A low temperature coefficient load resistor, not shown, may be deposited, annealed, and defined at this point.

Figure 1E:
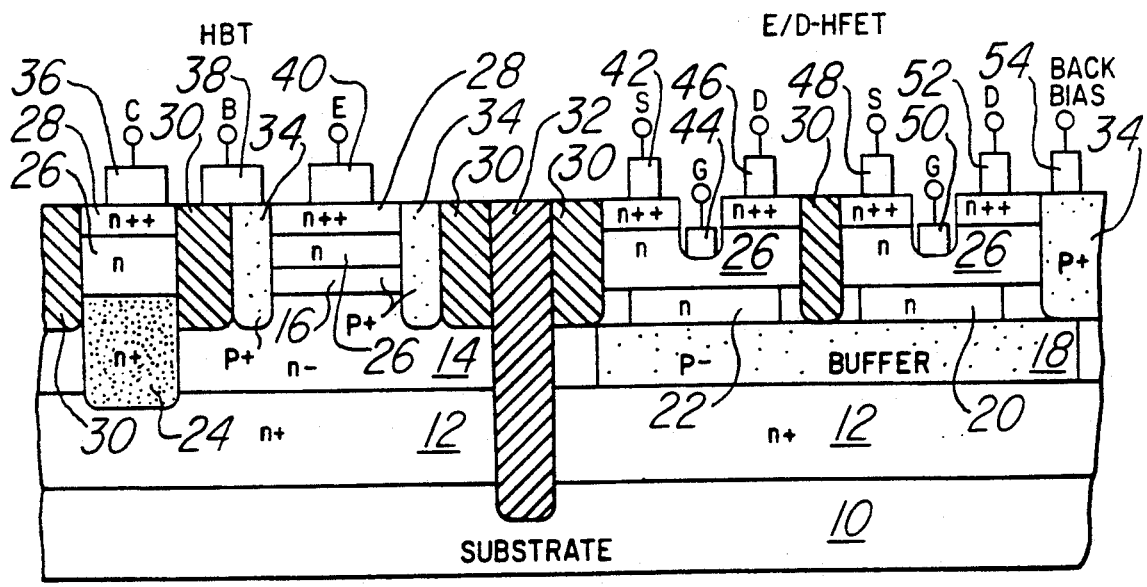

The n-ohmic and p-ohmic contact definition is illustrated in FIG. 1e. The emitter n-ohmic 40 and collector n-ohmic 36, for the HBT may be defined either simultaneously with the source n-ohmics 42,48 and drain n-ohmics 46,52 for the HFETs, or in a separate mask step. The base p-ohmic contact 38 of the HBT and the p-buffer layer p-ohmic contact 54 of the HFETs, may also be defined simultaneously. After the ohmics, the cap layer 28 is preferably dry-etched to remove the highly doped n-type epitaxial layer, not shown, eliminating a homojunction leakage path in the HBT. A $CCl_2F_2/H_2$ dry etch is highly selective and essentially stops at the AlGaAs emitter layer 26. The gate regions 44,50 for the HFETs may be defined next for both gate recess and Schottky metal deposition. This may be done either with a standard wet process or, preferably, with a dry etch or a combination of dry and wet etch to tailor the threshold voltages of the HFETs. Dry GaAs etching for both HBT leakage isolation and HFET gate recess may be done in an electron cyclotron resonance (ECR) remote plasma reactor. In an ECR reactor, the ion damage to the etched GaAs is minimized compared with a conventional reactive-ion etch (RIE) where the sample resides in the plasma.

The process may then go to a standard double-level metal process with $SiO_2$ dielectric and TiW Au sputter-deposited/etch-defined metal leads. This interconnection process gives high yield over the planar topography of the GaAs surface.

Figure 3:
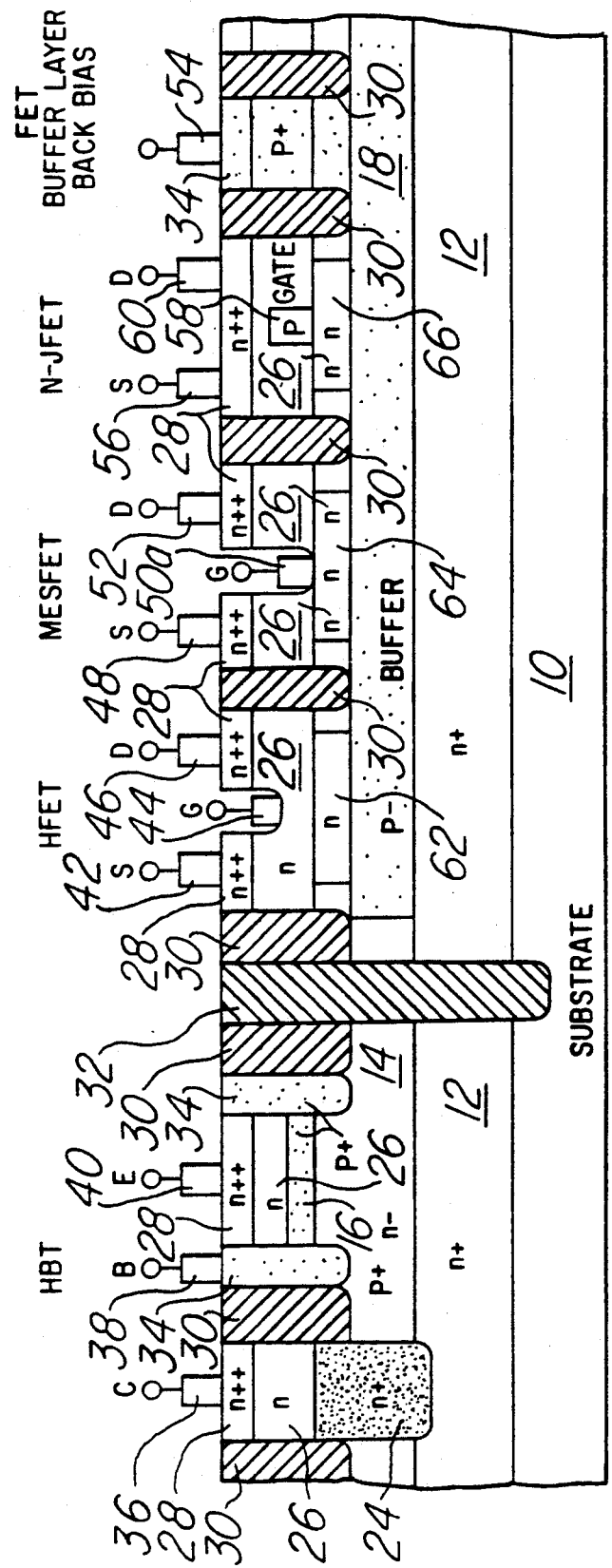
FIG. 3 is a cross-sectional view of an alternative embodiment of the present invention.

FIG. 3 shows an alternative embodiment which illustrates that MESFETs, HFETS and n-channel JFETs may be integrated into this merged BiFET process with nearly equal ease by taking advantage of the epitaxial layers grown for HBTs. Additions to the abovementioned process, to realize this embodiment, include: formation of the p type JFET gate 58 when the base pedestal 16 is formed; etching of the AlGaAs 26 to the channel 64 for Schottky gate contact 50a; additional and/or different implantations for the FET channels 62,64,66; and additional source 56 and drain 60 n-ohmic contacts for the JFET (these may be formed simultaneously with the other n-ohmics).

The BiFET process described above offers many advantages. For example, HBT and FET integration enables the integration of high speed linear circuits based on HBTs and the dense packed, low power memory/logic of FETs; the use of the emitter AlGaAs layer as the gate should raise the FET barrier height 100 to 300 meV benefiting memory cell design by improving noise margin and extending the operating temperature range; and the FET channel doping of the BiFET process will have better control than a standard E/D-MESFET process implanted into semi-insulating because the activation in the better quality epi layer is higher than in bulk GaAs.

A preferred embodiment has been described in detail hereinabove. It is to be understood that the scope of the invention also comprehends embodiments different from those described, yet within the scope of the claims. For example, the boron and oxygen used for isolation implants could be any material that provides the desired isolation such as boron, oxygen, or hydrogen implants. Similarly, instead of implantation an etch followed by a deposition process may be used to form all regions where implantation is used. The dopants referred to in the above description are Be for p type and Si for n type, however, the Be could be replaced with materials such as Zn, C, or Mg and the Si could be replaced with materials such as S, Se, or Sn. Similarly, the AlGaAs could be replaced with any appropriate wide bandgap material such as InGaP or InAlAs and the GaAs could be replaced with a material such as InGaAs. The preferred embodiment shows one HBT integrated with an enhancement mode HFET and a depletion mode HFET, however, any number of HBTs and HFETs may be integrated, and, as shown in the alternative embodiment in FIG. 3, MESFETS, JFETS, and other desired types of FETs may be integrated with HBTs and HFETs. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| ELEMENT NUMBER | DESCRIPTION |
| --- | --- |
| 10 | SUBSTRATE |
| 12 | SUBCOLLECTOR |
| 14 | COLLECTOR |
| 16 | BASE |
| 18 | FET BUFFER |
| 20 | FET DEPLETION CHANNEL |
| 22 | FET ENHANCEMENT CHANNEL |
| 24 | N+ IMPLANT |
| 26 | HBT EMITTER & FET GATES |
| 28 | CAP LAYER |

TABLE 1-continued

| ELEMENT NUMBER | DESCRIPTION |
| --- | --- |
| 30 | BORON IMPLANTS |
| 32 | OXYGEN IMPLANTS |
| 34 | P+ IMPLANTS |
| 36 | COLLECTOR CONTACT |
| 38 | BASE CONTACT |
| 40 | EMITTER CONTACT |
| 42 | SOURCE CONTACT |
| 44 | GATE CONTACT |
| 46 | DRAIN CONTACT |
| 48 | SOURCE CONTACT |
| 50 | GATE CONTACT |
| 50a | GATE CONTACT (ALTERNATE EMBODIMENT) |
| 52 | DRAIN CONTACT |
| 54 | BACK BIAS CONTACT |
| 56 | SOURCE CONTACT (ALTERNATE EMBODIMENT) |
| 58 | GATE (ALTERNATE EMBODIMENT) |
| 60 | DRAIN CONTACT (ALTERNATE EMBODIMENT) |
| 62 | FET CHANNEL (ALTERNATE EMBODIMENT) |
| 64 | FET CHANNEL (ALTERNATE EMBODIMENT) |
| 66 | FET CHANNEL (ALTERNATE EMBODIMENT) |

What is claimed is:

1. A method for fabricating integrated heterojunction bipolar transistors (HBTs) and heterojunction field effect transistors (HFETs) on a substrate; said method comprising:
   a. forming a subcollector layer over said substrate;
   b. forming a collector layer over said subcollector layer;
   c. forming a base layer over said collector layer;
   d. etching said base layer to form one or more base pedestals over a portion of said collector layer;
   e. forming a buffer region in a portion of said collector layer over which one or more HFETs are fabricated;
   f. forming one or more channel regions over said buffer region;
   g. forming a wide bandgap material emitter/gate layer over said base pedestal and said channel region; and
   h. forming isolation regions, whereby there is one or more separate HBTs and one or more separate HFETs over said substrate utilizing an epitaxially grown emitter/gate layer to form both an HBT emitter and an HFET gate.

2. The method of claim 1, wherein a highly doped low resistance contact to the top surface is formed in a portion of said collector layer and said subcollector layer prior to forming said emitter/gate layer.

3. The method of claim 1, wherein two HFET channels are formed, one being an enhancement channel and one being a depletion channel.

4. The method of claim 1, wherein a very highly doped cap layer is formed over said emitter/gate layer, whereby said cap layer improves ohmic contact on both the HBT and the HFET.

5. The method of claim 1, wherein said isolation regions are oxygen and/or boron, whereby said isolation region used to isolate the HBTs from the HFETs is deeper than the remainder of said isolation regions.

6. The method of claim 1, wherein grading layers are formed over and/or under said emitter/gate layer, whereby said grading layers provide a smooth bandgap transition and serve as an etch stop during selective etching.

7. The method of claim 1, wherein said emitter/gate layer is AlGaAs and said subcollector layer, said collector layer, and said base layer are GaAs.

8. The method of claim 1, wherein said channel regions, said buffer region, and said isolation regions are implanted.

9. The method of claim 1, wherein a MESFET, A J-FET and/or a MISFET is also formed over said buffer region.

10. The method of claim 1, wherein said HBTs are NPN and said HFETs are n-channel.

* * * * *